United States Patent
Zou et al.

(10) Patent No.: US 9,450,167 B2
(45) Date of Patent: Sep. 20, 2016

(54) TEMPERATURE COMPENSATED ACOUSTIC RESONATOR DEVICE HAVING AN INTERLAYER

(71) Applicant: Avago Technologies General IP (Singapore) Pte. Ltd., Singapore (SG)

(72) Inventors: Qiang Zou, Fort Collins, CO (US); Donald Lee, Fort Collins, CO (US); Martha K. Small, Fort Collins, CO (US); Frank Bi, Fort Collins, CO (US); Tina L. Lamers, For Collins, CO (US); Richard C. Ruby, Menlo Park, CA (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 411 days.

(21) Appl. No.: 14/040,469

(22) Filed: Sep. 27, 2013

(65) Prior Publication Data

US 2014/0292150 A1    Oct. 2, 2014

Related U.S. Application Data

(63) Continuation-in-part of application No. 13/852,469, filed on Mar. 28, 2013.

(51) Int. Cl.
*H01L 41/047* (2006.01)
*G10K 9/122* (2006.01)
*H03H 9/02* (2006.01)
(Continued)

(52) U.S. Cl.
CPC ........... *H01L 41/0477* (2013.01); *G10K 9/122* (2013.01); *G10K 11/04* (2013.01); *H03H 9/02102* (2013.01); *H03H 9/175* (2013.01)

(58) Field of Classification Search
CPC .......................... F02M 61/167; G10K 11/004
USPC ............ 310/313 A–313 D, 313 R, 320, 346, 310/363–365
See application file for complete search history.

(56) References Cited

U.S. PATENT DOCUMENTS

| 4,456,850 A | 6/1984 | Inoue et al. |
| 5,587,620 A | 12/1996 | Ruby et al. |

(Continued)

FOREIGN PATENT DOCUMENTS

| CN | 101958696 | 1/2011 |
| WO | WO2010122024 | 10/2010 |

OTHER PUBLICATIONS

Lin, "Temperature Compensation of Aluminum Nitride Lamb Wave Resonators Utilizing the Lowest-Order Symmetric Mode", Electrical Engineering and Computer Sciences, University of California at Berkeley, Dec. 14, 2012.

(Continued)

*Primary Examiner* — Thomas Dougherty

(57) ABSTRACT

An acoustic resonator comprises: an acoustic resonator device comprises: a composite first electrode disposed over a substrate, the composite first electrode comprising: a first electrically conductive layer provided over the substrate; a first interlayer disposed on the first electrical conductive layer; a buried temperature compensation layer disposed over the first interlayer; a second interlayer disposed over the temperature compensation layer; a second electrically conductive layer disposed over the second interlayer, a piezoelectric layer disposed over the composite first electrode; and a second electrode disposed over the piezoelectric layer.

22 Claims, 8 Drawing Sheets

(51) Int. Cl.
*H03H 9/17* (2006.01)
*G10K 11/04* (2006.01)

(56) References Cited

U.S. PATENT DOCUMENTS

| | | | |
|---|---|---|---|
| 5,873,153 | A | 2/1999 | Ruby et al. |
| 6,107,721 | A | 8/2000 | Lakin |
| 6,420,820 | B1 | 7/2002 | Larson, III |
| 6,441,539 | B1 | 8/2002 | Kitamura et al. |
| 6,507,983 | B1 | 1/2003 | Ruby et al. |
| 6,828,713 | B2 | 12/2004 | Bradley |
| 6,906,451 | B2 | 6/2005 | Yamada et al. |
| 6,936,954 | B2 | 8/2005 | Peczalski |
| 7,259,498 | B2 | 8/2007 | Nakatsuka et al. |
| 7,280,007 | B2 | 10/2007 | Feng et al. |
| 7,345,410 | B2 * | 3/2008 | Grannen ............... H03H 3/04 310/363 |
| 7,358,831 | B2 | 4/2008 | Larson, III et al. |
| 7,369,013 | B2 * | 5/2008 | Fazzio ............... H03H 9/02149 310/312 |
| 7,388,454 | B2 | 6/2008 | Ruby et al. |
| 7,561,009 | B2 | 7/2009 | Larson, III et al. |
| 7,562,429 | B2 | 7/2009 | Larson, III et al. |
| 7,629,865 | B2 | 12/2009 | Ruby |
| 8,248,185 | B2 | 8/2012 | Choy et al. |
| 8,330,556 | B2 | 12/2012 | Miller et al. |
| 8,456,257 | B1 * | 6/2013 | Fattinger ............ H03H 9/02086 310/312 |
| 9,209,776 | B2 | 12/2015 | Grannen et al. |
| 2005/0110598 | A1 * | 5/2005 | Larson ............... H03H 9/02102 333/191 |
| 2007/0205850 | A1 | 9/2007 | Jamneala et al. |
| 2010/0187948 | A1 * | 7/2010 | Sinha ................ H03H 9/02086 310/313 C |
| 2010/0327994 | A1 | 12/2010 | Choy et al. |
| 2011/0180391 | A1 | 7/2011 | Larson, III et al. |
| 2011/0266925 | A1 * | 11/2011 | Ruby ................... H03H 3/04 310/346 |
| 2012/0056694 | A1 | 3/2012 | Pang et al. |
| 2012/0154074 | A1 | 6/2012 | Ruby et al. |
| 2012/0177816 | A1 | 7/2012 | Larson, III et al. |
| 2012/0326807 | A1 | 12/2012 | Choy et al. |
| 2013/0049545 | A1 * | 2/2013 | Zou ..................... H03H 3/04 310/346 |
| 2014/0117815 | A1 * | 5/2014 | Bi ........................ H03H 3/04 310/346 |
| 2014/0118092 | A1 * | 5/2014 | Burak ................ H03H 9/132 333/187 |
| 2014/0292149 | A1 * | 10/2014 | Zou ..................... G10K 9/122 310/335 |
| 2015/0145610 | A1 * | 5/2015 | Ruby ................... H03H 9/10 331/107 R |

OTHER PUBLICATIONS

Ansari, et al. "Gallium Nitride-on-Silicon Micromechanical Overtone Resonators and Filters", Department of Electrical Engineering & Computer Science, University of Michigan, 2011.

Campanella, et al. "Sensitivity of thin-film bulk acoustic resonators (FBAR) to localized mechanical forces", Journal of Micromechanics and Microengineering 23, 2013.

Patent Board Decision dated Mar. 3, 2016 in co-pending U.S. Appl. No. 12/769,791.

Examiner's Answer dated May 16, 2013 in co-pending U.S. Appl. No. 12/769,791.

Advisory Action dated Dec. 12, 2012 in co-pending U.S. Appl. No. 12/769,791.

Final Office Action dated Sep. 25, 2012 in co-pending U.S. Appl. No. 12/769,791.

Office Action dated Apr. 30, 2012 in co-pending U.S. Appl. No. 12/769,791.

Notice of Withdrawal from Issue dated Apr. 11, 2012 in co-pending U.S. Appl. No. 12/769,791.

Notice of Allowance dated Dec. 5, 2011 in co-pending U.S. Appl. No. 12/769,791.

Notice of Allowance dated Nov. 23, 2011 in co-pending U.S. Appl. No. 12/769,791.

Office Action dated Aug. 15, 2011 in co-pending U.S. Appl. No. 12/769,791.

* cited by examiner

TEMPERATURE COMPENSATED ACOUSTIC RESONATOR DEVICE HAVING AN INTERLAYER

CROSS-REFERENCE TO RELATED APPLICATIONS

The present application is a continuation-in-part of and claims priority under 35 U.S.C. §120 from U.S. patent application Ser. No. 13/852,469 entitled "TEMPERATURE COMPENSATED ACOUSTIC RESONATOR DEVICE" to Qiang Zou, et al. and filed on Mar. 28, 2013. The disclosure of this parent application is specifically incorporated herein by reference.

BACKGROUND

Electrical resonators are widely incorporated in modern electronic devices. For example, in wireless communications devices, radio frequency (RF) and microwave frequency resonators are used as filters, such as ladder filters having electrically connected series and shunt resonators formed in a ladder structure. The filters may be included in a duplexer, for example, connected between a single antenna and a receiver and a transmitter for respectively filtering received and transmitted signals.

Various types of filters use mechanical resonators, such as bulk acoustic wave (BAW), surface acoustic wave (SAW), and solidly mounted resonator (SMR)-BAW resonators. The resonators generally convert electrical signals to mechanical signals or vibrations, and/or mechanical signals or vibrations to electrical signals. A BAW resonator, for example, is an acoustic stack that generally includes a layer of piezoelectric material between two electrodes. Acoustic waves achieve resonance across the acoustic stack, with the resonant frequency of the waves being determined by the materials in the acoustic stack and the thickness of each layer (e.g., piezoelectric layer and electrode layers). One type of BAW resonator uses an air cavity for acoustic isolation instead of being solidly mounted and may be referred to as a film bulk acoustic resonator (FBAR). FBARs, like other BAW devices, can be made to resonate at GHz frequencies, and are relatively compact, having thicknesses on the order of microns and length and width dimensions of hundreds of microns. This makes them well-suited to many applications in high-frequency communications.

Resonators may be used as band-pass filters with associated passbands providing ranges of frequencies permitted to pass through the filters. The passbands of the resonator filters tend to shift in response to environmental and operational factors, such as changes in temperature and/or incident power. For example, the passband of a resonator filter moves lower in frequency in response to rising temperature and higher incident power.

Cellular phones, in particular, are negatively affected by shifts in passband due to fluctuations in temperature and power. For example, a cellular phone includes power amplifiers (PAs) that must be able to deal with larger than expected insertion losses at the edges of the filter (duplexer). As the filter passband shifts down in frequency, e.g., due to rising temperature, the point of maximum absorption of power in the filter, which is designed to be above the passband, moves down into the frequency range of the FCC or government designated passband. At this point, the filter begins to absorb more power from the PA and heats up, causing the temperature to increase further. Thus, the filter passband shifts down in frequency more, bringing the maximum filter absorbing point even closer. This sets up a potential runaway situation, which is avoided only by the fact that the reflected power becomes large and the filter eventually settles at some high temperature.

PAs are designed specifically to handle the worst case power handling of the filter at the corner of the pass band. Currents of a typical PA can run from a few mA at the center of the filter passband to about 380 mA-450 mA at the edges. This is a huge power draw on the PA, as well as the battery that drives the cellular phone. This is one reason that a cellular phone operating more in the transmit mode (i.e., talk time) than in the receive mode (i.e., listening time) drains battery power more quickly.

In order to prevent or reduce frequency shift with rising temperatures, a conventional filter may include a layer of oxide material within the piezoelectric layer of the acoustic stack. The oxide material has a positive temperature coefficient of elastic modulus over a certain temperature range. The positive temperature coefficient of the oxide material at least partially offsets the negative temperature coefficients of the metal electrodes and the piezoelectric material, respectively. For example, the oxide material may be placed in the center of the piezoelectric layer or at either end of the piezoelectric layer between the electrodes. However, the acoustic coupling coefficient ($kt^2$) of the resonator is greatly compromised by the addition of oxide material to the piezoelectric layer. This is because the oxide material appears as a "dead" capacitor in series with the active piezoelectric material dielectric.

Furthermore, the piezoelectric layer is often grown over the oxide material used for temperature compensation. The temperature compensation layer is generally an amorphous film and therefore is not an oriented crystalline material. As such, the piezoelectric layer grown on certain known temperature compensation layers (e.g., silicon dioxide) will not have a poor crystalline structure, and a random mixture of c-axis orientations in the thin film, which prevents good piezoelectric response. By contrast, it is desirable to form a highly textured C-axis piezoelectric material demonstrating excellent piezoelectric properties.

What is needed, therefore, is a temperature compensated acoustic resonator device that overcomes at least some of the noted shortcomings of known acoustic resonator devices described above.

BRIEF DESCRIPTION OF THE DRAWINGS

The example embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements.

DETAILED DESCRIPTION

Figure 1:
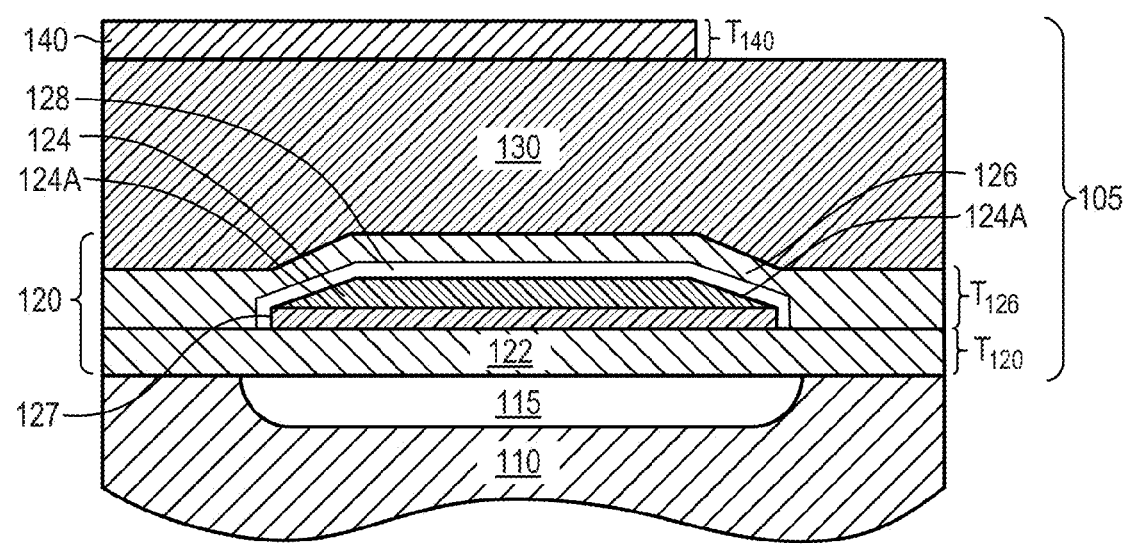
FIG. 1 is a cross-sectional diagram illustrating an acoustic resonator device, including an electrode with a buried temperature compensating layer according to a representative embodiment.

In the following detailed description, for purposes of explanation and not limitation, representative embodiments disclosing specific details are set forth in order to provide a thorough understanding of the present teachings. However, it will be apparent to one having ordinary skill in the art having had the benefit of the present disclosure that other embodiments according to the present teachings that depart from the specific details disclosed herein remain within the scope of the appended claims. Moreover, descriptions of well-known apparatuses and methods may be omitted so as to not obscure the description of the representative embodiments. Such methods and apparatuses are clearly within the scope of the present teachings.

Generally, it is understood that the drawings and the various elements depicted therein are not drawn to scale. Further, relative terms, such as "above," "below," "top," "bottom," "upper," "lower," "left," "right," "vertical" and "horizontal," are used to describe the various elements' relationships to one another, as illustrated in the accompanying drawings. It is understood that these relative terms are intended to encompass different orientations of the device and/or elements in addition to the orientation depicted in the drawings. For example, if the device were inverted with respect to the view in the drawings, an element described as "above" another element, for example, would now be "below" that element. Likewise, if the device were rotated 90 degrees with respect to the view in the drawings, an element described as "vertical," for example, would now be "horizontal."

Aspects of the present teachings are relevant to components of BAW and FBAR devices and filters, their materials and their methods of fabrication. Various details of such devices and corresponding methods of fabrication may be found, for example, in one or more of the following U.S. patent publications: U.S. Pat. No. 6,107,721, to Lakin; U.S. Pat. Nos. 5,587,620, 5,873,153, 6,507,983, 7,388,454 and 7,629,865 to Ruby et al.; U.S. Pat. No. 7,280,007 to Feng et al.; U.S. Pat. No. 8,248,185 to Choy, et al.; U.S. Pat. No. 7,345,410 to Grannen, et al.; U.S. Pat. No. 6,828,713 to Bradley, et al.: U.S. Patent Application Publication 20120326807 to Choy, et al.; U.S. Patent Application Publication 20100327994 to Choy, et al., U.S. Patent Application Publications 20110180391 and 20120177816 to Larson, et al., and U.S. Patent Application Pub. No. 20070205850 to Jamneala et al. The entire disclosure of each of the patents and published patent applications listed above are hereby specifically incorporated by reference herein. It is emphasized that the components, materials and method of fabrication described in these patents and patent applications are representative and other methods of fabrication and materials within the purview of one of ordinary skill in the art are also contemplated.

According to various representative embodiments, a resonator device has an acoustic stack with a piezoelectric layer between top and bottom electrodes, at least one of which is a composite electrode having a temperature compensating layer deposited between an electrode layer and a conductive interposer layer. As used herein, a material having a "positive temperature coefficient" means the material has positive temperature coefficient of elastic modulus over a certain temperature range. Similarly, a material having a "negative temperature coefficient" means the material has negative temperature coefficient of elastic modulus over the (same) certain temperature range. The temperature compensating layer may be formed of an oxide material, such as silicon dioxide ($SiO_2$), or undoped silica glass (USG), or fluorine-doped silica glass, or borosilicate glass (BSG), for example, having a positive temperature coefficient which offsets at least a portion of the negative temperature coefficients of the piezoelectric layer and the conductive material in the top and bottom electrodes. The conductive interposer layer thus makes a DC electrical connection with the electrode layer in the composite electrode, effectively shorting out a capacitive component of the temperature compensating layer and increasing a coupling coefficient $kt^2$ of the resonator device. Also, the conductive interposer, which is positioned between the temperature compensating layer and the piezoelectric layer, presents a barrier preventing oxygen in the oxide layer from diffusing into the piezoelectric material of the piezoelectric layer. In various embodiments, the composite electrode may be the bottom electrode, the top electrode, or both, in the acoustic stack.

According to other representative embodiments, in addition to the selection of a suitable temperature compensation layer having a positive temperature coefficient as described above, at least one interlayer is provided in the acoustic stack. In one representative embodiment a first interlayer is disposed over the substrate and beneath a first electrically conductive layer; and a second interlayer is provided over a second electrically conductive layer. In another representative embodiment, an interlayer is disposed over the substrate and beneath a first electrically conductive layer. In yet another representative embodiment, an interlayer is provided over a first electrically conductive layer, which is disposed over a piezoelectric layer, and beneath a temperature compensation layer. As described more fully below improved temperature compensation for the acoustic stack of the acoustic resonator, or an improved acoustic coupling coefficient ($kt^2$) of the acoustic resonator device, or both can be realized by the use of the interlayer(s) of the representative embodiments.

FIG. 1 is a cross-sectional view of an acoustic resonator device, which includes an electrode having a buried temperature compensating layer, according to a representative embodiment.

Referring to FIG. 1, illustrative acoustic resonator device 100 includes acoustic stack 105 formed on substrate 110. The substrate 110 may be formed of various types of materials compatible with wafer-scale processes, such as silicon (Si), gallium arsenide (GaAs), indium phosphide (InP), silicon dioxide, alumina, or the like, thus reducing the cost of the final part. In the depicted embodiment, the substrate 110 includes a cavity 115 formed beneath the acoustic stack 105 to provide acoustic isolation, such that the acoustic stack 105 is suspended over an air space to enable mechanical movement. In alternative embodiments, the substrate 110 may be formed with no cavity 115, for example, using SMR technology. For example, the acoustic stack 105 may be formed over an acoustic mirror or a Bragg Reflector (not shown), having alternating layers of high and low acoustic impedance materials, formed in or on the substrate 110. An acoustic reflector may be fabricated according to various techniques, an example of which is described in U.S. Pat. No. 7,358,831 to Larson, III, et al., the disclosure of which is hereby specifically incorporated by reference herein.

The acoustic stack 105 includes piezoelectric layer 130 formed between composite first electrode 120 and second electrode 140. In the presently described representative embodiment, the composite first electrode 120 includes multiple layers, and is referred to herein as a "composite electrode." In various embodiments, the composite first electrode 120 includes a base electrode layer 122, a buried temperature compensation layer 124, and a conductive interposer layer 126 stacked sequentially on the substrate 110. In a representative embodiment, the base electrode layer 122 or the conductive interposer layer 126, or both are formed of electrically conductive materials, such as various metals compatible with wafer processes, including tungsten (W), molybdenum (Mo), aluminum (Al), platinum (Pt), ruthenium (Ru), niobium (Nb), or hafnium (Hf), for example. In certain representative embodiments, at least one of the electrically conductive layers of the base electrode layer 122 and the conductive interposer layer 126 is made of a material that has a positive temperature coefficient. In accordance with a representative embodiment, the material having the positive temperature coefficient is an alloy. Illustratively, the alloy may be one of nickel-iron (Ni—Fe), niobium-molybdenum (NbMo) and nickel-titanium (NiTi).

In a representative embodiment, a first interlayer 127 can be provided beneath the buried temperature compensation layer 124 and over the base electrode layer 122, and a second interlayer 128 can be disposed over the temperature compensation layer and beneath the piezoelectric layer 130. As described more fully below, the first interlayer 127 functions as an etch-stop layer during the formation of the buried temperature compensation, and may be useful in improving positive temperature compensation effects in the acoustic stack. Moreover, and as described more fully below, the second interlayer 128 functions as a seed layer to foster growth of a highly textured piezoelectric layer 130, and may be useful in improving positive temperature compensation effects in the acoustic stack.

In a representative embodiment, conductive interposer layer 126, or the base electrode layer 122, or both, comprise a material having a positive temperature coefficient. Notably, the material selected for the conductive interposer layer 126 should be selected to not adversely impact the quality of the crystalline structure of the piezoelectric layer 130. Stated somewhat differently, as it is desirable to provide a highly textured (i.e., well oriented C-axis) piezoelectric layer in the acoustic stack 105, it is beneficial to use a material for the conductive interposer layer 126 that will allow growth of a highly textured piezoelectric layer 130. Beneficially, the second interlayer 128 can help to obviate the need for selecting a material that does not adversely impact the crystalline orientation of the piezoelectric layer 130.

Finally, it is contemplated that the base electrode layer 122, the conductive interposer layer 126 and the second electrode 140 be made from one or more materials having a positive temperature coefficient to further reduce or substantially prevent the adverse impact on frequency at higher temperatures of operation.

The positive temperature coefficient of the selected base electrode layer 122, or the conductive interposer layer 126, or both, beneficially offsets negative temperature coefficients of other materials in the acoustic stack 105, including for example the piezoelectric layer 130, the second electrode 140, and any other layer of the acoustic stack that has a negative temperature coefficient. Beneficially, the inclusion of one or more layers of materials having the positive temperature coefficient for electrically conductive layers in the acoustic stack allows the same degree of temperature compensation with a thinner buried temperature compensation layer 124. Ultimately, the acoustic resonator device 100 has at least the same temperature compensation as an embodiment having base electrode layer 122, conductive interposer layer 126 and second electrode 140 made of materials with negative temperature coefficients, while at the same time having an improved coupling coefficient $kt^2$.

In various embodiments, the base electrode layer 122 and the conductive interposer layer 126 are formed of different conductive materials, where the base electrode layer 122 is formed of a material having relatively lower conductivity and relatively higher acoustic impedance, and the conductive interposer layer 126 is formed of a material having relatively higher conductivity and relatively lower acoustic impedance. For example, the base electrode layer 122 may be formed of W, Ni—Fe, NbMo, or NiTi, and the conductive interposer layer 126 may be formed of Mo, although other materials and/or combinations of materials may be used without departing from the scope of the present teachings. In accordance with a representative embodiment, the selection of the material for the conductive interposer layer 126 is made to foster growth of highly textured piezoelectric material that forms piezoelectric layer 230. Further, in various embodiments, the base electrode layer 122 and the conductive interposer layer 126 may be formed of the same conductive material, without departing from the scope of the present teachings.

As should be appreciated by one of ordinary skill in the art, the electrical conductivity and the acoustic impedance depend on the material selected for the positive temperature coefficient material provided in the acoustic stack 105. Moreover, the acoustic impedance and electrical conductivity of the positive temperature coefficient material will impact its location in the acoustic stack 105. Typically, it is useful to provide a positive temperature coefficient material having a comparatively high acoustic impedance in order to achieve a higher acoustic coupling coefficient ($kt^2$), thereby allowing a comparatively thin piezoelectric layer 130 to be provided in the acoustic stack 105. Moreover, it is useful to provide a positive temperature coefficient material having a comparatively low electrical resistance to avoid ohmic (resistive) losses in the acoustic resonator device 100. Finally, the present teachings contemplate the use of a multi-layer structure for the layer(s) of the acoustic stack having a positive temperature coefficient to achieve a comparatively high acoustic impedance and a comparatively low electrical conductivity.

The buried temperature compensation layer 124 is a temperature compensating layer, and is formed between the base electrode layer 122 and the conductive interposer layer 126. The buried temperature compensation layer 124 is therefore separated or isolated from the piezoelectric layer 130 by the conductive interposer layer 126, and is otherwise sealed in by the connection between the conductive interposer layer 126 and the base electrode layer 122. Accordingly, the buried temperature compensation layer 124 is effectively buried within the composite first electrode 120.

The buried temperature compensation layer 124 may be formed of various materials compatible with wafer processes, including silicon dioxide ($SiO_2$), borosilicate glass (BSG), chromium oxide ($Cr_{(x)}O_{(y)}$) or tellurium oxide ($TeO_{(x)}$), for example, which have positive temperature coefficients. The positive temperature coefficient of the buried temperature compensation layer 124 offsets negative temperature coefficients of other materials in the acoustic stack 105, including the piezoelectric layer 130, and other electrically conductive layers that are not selected to comprise a material having a positive temperature coefficient (i.e., one or more of the second electrode 140, the base electrode layer 122 and the conductive interposer layer 126 of the composite first electrode 120, which do not comprise an electrically conductive material having a positive temperature coefficient.)

As noted previously, at least one of the base electrode layer 122, the conductive interposer layer 126 and the second electrode 140 may be made of a material that has a positive temperature coefficient. As such, the second electrode 140 may be made of material having the positive temperature coefficient, while one or both of the base electrode layer 122 and the conductive interposer layer 126 are made of a material having a negative temperature coefficient. As noted above, the material having a positive temperature coefficient may be an alloy. Illustratively, the alloy may be one of nickel-iron (Ni—Fe), niobium-molybdenum (NbMo) and nickel-titanium (NiTi). The positive temperature coefficient of the second electrode 140 beneficially offsets negative temperature coefficients of other materials in the acoustic stack 105, including for example the piezoelectric layer 130 and any other layer of the acoustic stack 105 that has a negative temperature coefficient. Beneficially, the inclusion of one or more layers of materials having the positive temperature coefficient for electrically conductive layers in the acoustic stack 105 allows the same degree of temperature compensation with a thinner buried temperature compensation layer 124. Ultimately, the acoustic resonator device 100 has at least the same temperature compensation as an embodiment having base electrode layer 122, conductive interposer layer 126 and second electrode 140 made of materials with negative temperature coefficients, while at the same time having an improved coupling coefficient $kt^2$.

As shown in the representative embodiment of FIG. 1, the buried temperature compensation layer 124 does not extend the full width of the acoustic stack 105. Thus, the conductive interposer layer 126, which is formed on the top and side surfaces of the buried temperature compensation layer 124, contacts the top surface of the base electrode layer 122, as indicated for example by reference number 129. Therefore, a DC electrical connection is formed between the conductive interposer layer 126 and the base electrode layer 122. By DC electrically connecting with the base electrode layer 122, the conductive interposer layer 126 effectively "shorts" out a capacitive component of the buried temperature compensation layer 124, thus increasing a coupling coefficient ($kt^2$) of the acoustic resonator device 100. In addition, the conductive interposer layer 126 provides a barrier that prevents oxygen in the buried temperature compensation layer 124 from diffusing into the piezoelectric layer 130, preventing contamination of the piezoelectric layer 130.

Also, in the depicted embodiment, the buried temperature compensation layer 124 has tapered edges 124A, which enhance the DC electrical connection between the conductive interposer layer 126 and the base electrode layer 122. In addition, the tapered edges 124A enhance the mechanical connection between the conductive interposer layer 126 and the base electrode layer 122, which improves the sealing quality, e.g., for preventing oxygen in the buried temperature compensation layer 124 from diffusing into the piezoelectric layer 130. In alternative embodiments, the edges of the buried temperature compensation layer 124 are not tapered, but may be substantially perpendicular to the top and bottom surfaces of the buried temperature compensation layer 124, for example, without departing from the scope of the present teachings.

In accordance with representative embodiments, the first interlayer 127 is selected as an etch stop layer during the formation of the buried temperature compensation layer 124. As noted above, the buried temperature compensation layer 124 is illustratively silicon dioxide ($SiO_2$), or borosilicate glass (BSG), or chromium oxide ($Cr_{(x)}O_{(y)}$), or tellurium oxide ($TeO_{(x)}$). The first interlayer 127 illustratively comprises a layer of aluminum nitride (AlN) having a thickness in the range of approximately $10^1$ Å to approximately $10^3$ Å. In certain embodiments, the first interlayer 127 is AlN having a thickness in the range of approximately 60 Å to approximately 150 Å. It is noted while the use of AlN as an etch-stop layer is merely illustrative, other materials are contemplated for use as the first interlayer 127, depending on the selection of material for the buried temperature compensation layer 124. For example, the first interlayer 127 may be a metal (e.g., aluminum (Al)), a non-metal, a ceramic (e.g., silicon carbide (SiC)), an alloy (e.g., titanium tungsten (TiW)), a compound (e.g., titanium oxynitride ($TiO_xN_y$)), or an element useful in providing an etch-stop during formation of the buried temperature compensation layer 124.

In addition to its etch-stop properties, and as described more fully below, the first interlayer 127 made of AlN has been found to improve positive temperature compensation in the acoustic stack. It is theorized that the first interlayer 127 functions as a diffusion barrier which helps to prevent oxide diffusion from buried temperature compensation layer 124 to the base electrode layer 122, and thereby prevents the formation of other materials with negative temperature coefficients.

The piezoelectric layer 130 is formed over the top surface of the conductive interposer layer 126. The piezoelectric layer 130 may be formed of a thin film piezoelectric material compatible with wafer processes, such as aluminum nitride (AlN), zinc oxide (ZnO), lead zirconium titanate (PZT), or the like. The piezoelectric layer 130 may be fabricated according to various known techniques, examples of which are found in certain patents and patent application publications incorporated by reference above.

The thickness of the piezoelectric layer 130 may range from about 1000 Å to about 100,000 Å, for example, although the thickness may vary to provide unique benefits for any particular situation or to meet application specific design requirements of various implementations, as would be apparent to one of ordinary skill in the art.

In a representative embodiment, the piezoelectric layer 130 is formed over or directly on the second interlayer 128, which is disposed over an upper surface of the composite first electrode 120. The second interlayer 128 functions as a seed layer for the growth of piezoelectric layer 130 having a well-oriented C-axis. As such, and as noted above, the material selected for the second interlayer 128 is useful in fostering growth of a highly textured piezoelectric layer 130. For example, the second interlayer 128 may be formed of AlN. Alternatively, the second interlayer 128 may be formed of materials with a hexagonal crystal structure (such as Titanium, Ruthenium) selected to foster growth of piezoelectric layer 130 that is illustratively AlN. Still alternatively, the second interlayer 128 may comprise a composition of the same piezoelectric layer (e.g., AlN) as the piezoelectric layer 130 and a hexagonal crystal structure material. The second interlayer 128 may have a thickness in the range of about 50 Å to about 5000 Å, for example.

The second electrode 140 is formed on the top surface of the piezoelectric layer 130. The second electrode 140 is formed of an electrically conductive material compatible with wafer processes, such as Mo, W, Al, Pt, Ru, Nb, Hf, or the like. In an embodiment, the second electrode 140 is formed of the same material as the base electrode layer 122 of the composite first electrode 120. However, in various embodiments, the second electrode 140 may be formed of the same material as only the conductive interposer layer 126; the second electrode 140, the conductive interposer layer 126 and the base electrode layer 122 may all be formed of the same material; or the second electrode 140 may be formed of a different material than both the conductive interposer layer 126 and the base electrode layer 122, without departing from the scope of the present teachings.

The second electrode 140 may further include a passivation layer (not shown), which may be formed of various types of materials, including AlN, silicon carbide (SiC), BSG, $SiO_2$, SiN, polysilicon, and the like. Illustratively, the passivation layer may be as described in U.S. Pat. No. 8,330,556, to Miller, et al. The disclosure of this patent is specifically incorporated herein by reference. The thickness of the passivation layer must be sufficient to insulate all layers of the acoustic stack 105 from the environment, including protection from moisture, corrosives, contaminants, debris and the like. The composite first 120 and second electrode 140 are electrically connected to external circuitry via contact pads (not shown), which may be formed of a conductive material, such as gold, gold-tin alloy or the like.

In an embodiment, an overall first thickness $T_{120}$ of the composite first electrode 120 is substantially the same as an overall second thickness $T_{140}$ of the second electrode 140, as shown in FIG. 1. For example, the thickness of each of the composite first electrode 120 and the second electrodes 140 may range from about 600 Å to about 30000 Å, although the thicknesses may vary to provide unique benefits for any particular situation or to meet application specific design requirements of various implementations, as would be apparent to one of ordinary skill in the art.

The multiple layers of the composite first electrode 120 have corresponding thicknesses. For example, the thickness of base electrode layer 122 may range from about 400 Å to about 29,900 Å, the thickness of buried temperature compensation layer 124 may range from about 100 Å to about 5000 Å, and the thickness of conductive interposer layer 126 may range from about 100 Å to about 10000 Å. As a general consideration, the thickness of the layers of the acoustic stack 105 depend not only on the thickness of the buried temperature compensation layer 124, but also on the desired acoustic coupling coefficient ($kt^2$), the targeted temperature response profile, and the frequency target of the acoustic resonator device 100. As such, the extent to which the thickness of the buried temperature compensation layer 124 can be reduced through the inclusion of one or more layers of the acoustic stack 105 that have a positive temperature coefficient depends on the magnitude of the positive temperature coefficient of the material used, the thickness(es) of the one or more layers of the acoustic stack 105 that have a positive temperature coefficient, the desired acoustic coupling coefficient ($kt^2$), and the desired frequency target of the acoustic stack 105.

Each of the layers of the composite first electrode 120 may be varied to produce different characteristics with respect to temperature coefficients and coupling coefficients, while the overall first thickness $T_{120}$ of the composite first electrode 120 may be varied with the overall second thickness $T_{140}$ of the second electrode 140. As such, the first thickness $T_{120}$, of the composite first electrode 120 and overall second thickness $T_{140}$ of the second electrode 140 may be the same, or may differ depending on the desired temperature coefficient, acoustic coupling coefficient ($kt^2$) and frequency target of the acoustic stack 105. Similarly, the thickness of the buried temperature compensation layer 124 may be varied to affect the overall temperature coefficient of the acoustic stack 105, and the relative thicknesses of the base electrode layer 122 and the conductive interposer layer 126 may be varied to affect the overall coupling coefficient of the acoustic resonator device 100.

According to various embodiments, the resonator device may be fabricated using various techniques compatible with wafer processes. A non-limiting example of a fabrication process directed to representative acoustic resonator device 100 is discussed below with reference to FIGS. 2A-2E.

Referring to FIGS. 2A-2E, in an illustrative fabrication sequence for forming the base electrode layer 122, the first interlayer 127, the buried temperature compensation layer 124 and the second interlayer 128 is described. It is noted that the formation of the remaining portions of the configuration of the acoustic resonator device 100 follow from the description of the parent application, or one or more of the incorporated patents and patent application publications.

In representative embodiments, the substrate 110 is formed of Si and the base electrode layer 122 is formed of W, for example, although different materials may be used, as discussed above, without departing from the scope of the present teachings. The base electrode layer 122 may be applied using spin-on, sputtering, evaporation or chemical vapor disposition (CVD) techniques, for example, although other application methods may be incorporated.

Notably, formation of the cavity 115 in the substrate 110 may be carried out before fabrication of the acoustic stack 105, wherein the cavity 115 is initially filled with a sacrificial material (not shown), such as phosphosilicate glass (PSG) or other release processes, such as polysilicon and xenon difluoride etchant, as would be apparent to one of ordinary skill in the art, during fabrication of layers of the acoustic stack 105. The release of the sacrificial material to form the cavity 115 is carried out using a suitable etchant, such as HF, after fabrication of the layers of the acoustic stack 105 (e.g., after formation of the second electrode 140). In alternative configurations, the cavity 115 may pass through the substrate 110 to form a backside opening, which may be formed by back side etching a bottom surface of the substrate 110. The back side etching may include a dry etch process, such as a Bosch process, for example, although various alternative techniques may be incorporated.

Alternatively, the substrate 110 may include an acoustic isolator, such as an acoustic mirror or Bragg Reflectors, rather than the cavity 115. Such acoustic isolators may be formed in the substrate 110 using any technique compatible with wafer processes before forming the acoustic stack 105, as would be apparent to one of ordinary skill in the art.

Figure 2A:
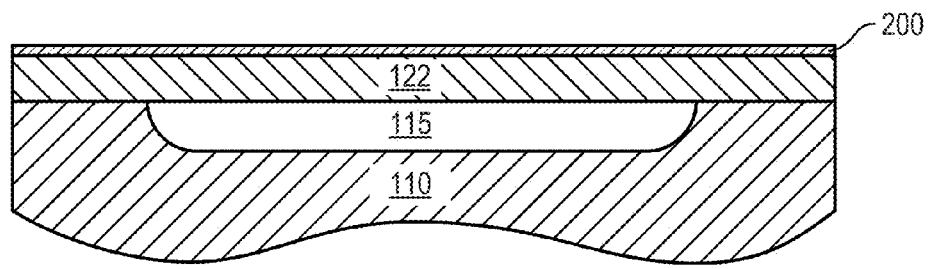
FIGS. 2A-2E are cross-sectional views illustrating a fabrication sequence for forming an acoustic resonator device in accordance with a representative embodiment.

The first interlayer 127 is formed over the base electrode layer 122 as depicted in FIG. 2A. In a representative embodiment, the first interlayer 127 is AlN and is grown or deposited over the upper surface of the base electrode layer 122 using one of a number of known methods, such as, for example, a known sputtering method. As noted above, providing AlN having a thickness in the range of $10^1$ Å to approximately $10^3$ Å as the first interlayer 127 suffices to terminate etching of the buried temperature compensation layer 124, and improve the positive temperature compensation in the acoustic stack.

Figure 2B:
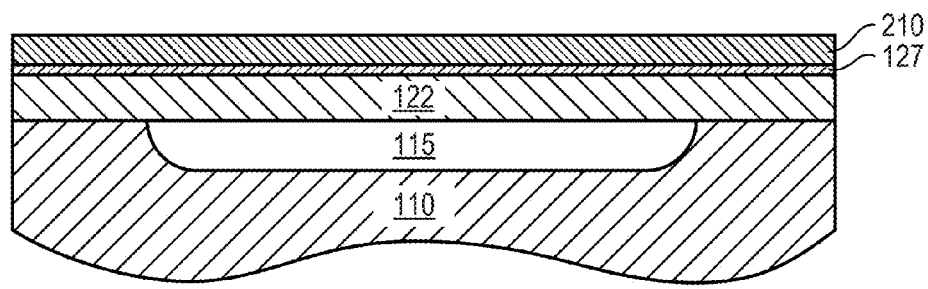

Turning to FIG. 2B, a layer 210 of material useful as the buried temperature compensation layer 124 is deposited over the first interlayer 127. Layer 210 may be applied using spin-on, sputtering, evaporation or CVD techniques, for example, although other application methods may be incorporated. Various illustrative techniques for forming temperature compensating layers are described, for example, in U.S. Pat. No. 7,561,009 to Larson, III., et al., which is hereby incorporated by reference. In a representative embodiment, layer 210 is formed at a thickness of about 1000 Å using a thin film of BSG (e.g., about two percent by weight boron), which provides a large positive temperature coefficient (e.g., up to about 350 ppm per deg C). PECVD or PVD $SiO_2$ can also be used as buried temperature compensation layer 124. Notably, however if the buried temperature compensation layer 124 is made of $SiO_2$ as opposed to BSG, the thickness of the $SiO_2$ is approximately 20% greater than that of the BSG layer in order to achieve the same positive temperature compensation value. Each of the first thickness $T_{120}$ of the composite first electrode 120 and the second thickness $T_{140}$ of the second electrode 140 (including a passivation layer) is about 3000 Å.

Figure 2C:
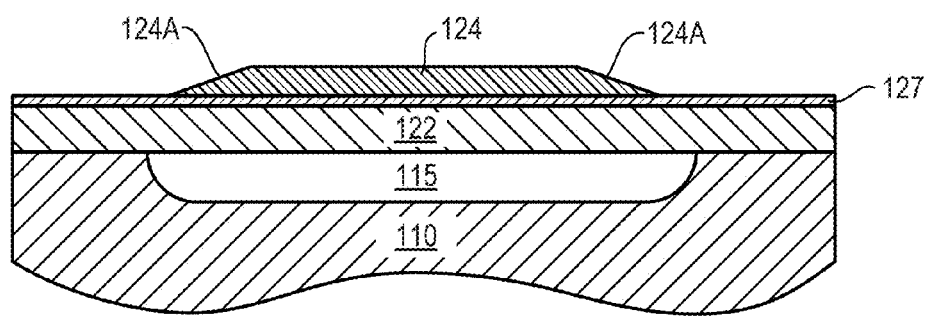

Turning to FIG. 2C, the buried temperature compensation layer 124 is etched to a desired size and the tapered edges 124A are tapered using standard wafer processing methods including photolithography, dry etching and photoresist strip as would be apparent to one of ordinary skill in the art. For example, a photoresist layer (not shown) may be applied to the top surface of the buried temperature compensation layer 124 and patterned to form a mask or photoresist pattern, using any photoresist patterning technique compatible with wafer processes, as would be apparent to one of ordinary skill in the art. The photoresist pattern may be formed by machining or by chemically etching the photoresist layer using photolithography, although various alternative techniques may be incorporated. Following etching of the buried temperature compensation layer 124, the photoresist pattern is removed, for example, by chemically releasing or etching using a wet etch process including HF etch solution, although the photoresist pattern may be removed by various other techniques, without departing from the scope of the present teachings.

In various embodiments, to obtain the tapered edges 124A, oxygen is leaked into the etchant used to etch the buried temperature compensation layer 124. The oxide (and/or temperature chuck) causes the photoresist to erode more quickly at the edges of the patterned photo resist and to pull back slightly. This "thinning" of the resist forms a wedge shape profile that is then imprinted into the oxide underneath as the photoresist goes away. Generally, the wedge is created by adjusting the etch rate of resist relative to the etched material, as would be apparent to one of ordinary skill in the art. Meanwhile, further from the edges of the buried temperature compensation layer 124, there is sufficient photoresist coverage throughout the etch that the underlying oxide material is not touched. Of course, other methods of obtaining tapered edges may be incorporated without departing from the scope of the present teachings.

Figure 2D:
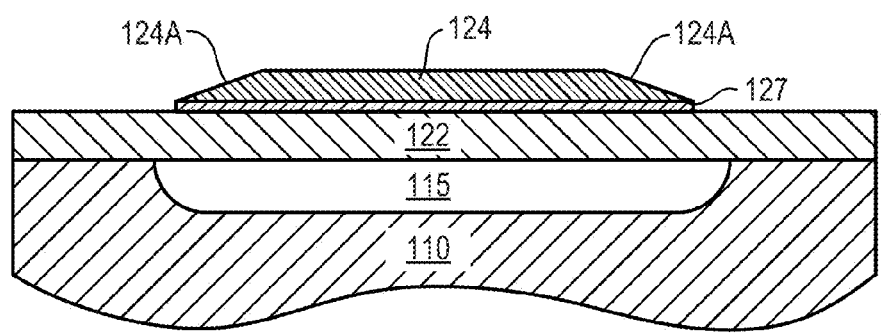

Turning to FIG. 2D, a selective etch is used to remove portions of the first interlayer 127 formed over the substrate, while the portion of the first interlayer 127 beneath the buried temperature compensation layer 124 remains intact. For example, if AlN is used as the first interlayer 127, a short time tetramethylammonium hydroxide (TMAH) wet etching sequence is used to selectively remove the first interlayer.

Figure 2E:
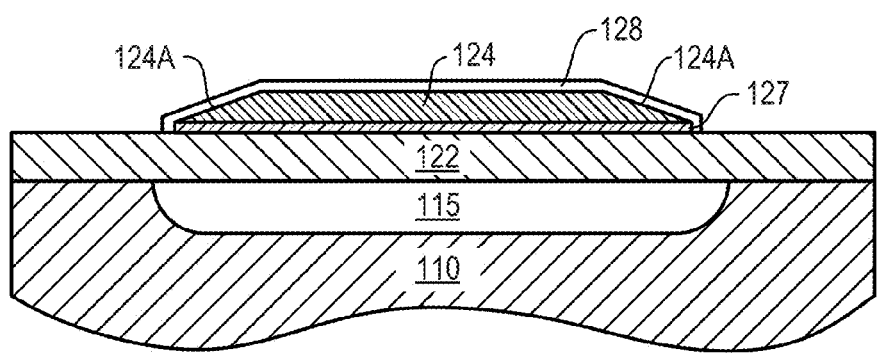

Turning to FIG. 2E, second interlayer 128 is deposited over an upper surface of the buried temperature compensation layer 124, and patterned by a known method. As noted above, the second interlayer 128 functions as a seed layer and may be formed of the same piezoelectric material as the piezoelectric layer 130, such as AlN, for example. Alternatively, the second interlayer 128 may be a material having a hexagonal crystal structure (e.g., Titanium or Ruthenium), which functions as a seed layer. Still alternatively, the second interlayer 128 may comprise a composition of the same piezoelectric layer (e.g., AlN) as piezoelectric layer 130 and a hexagonal crystal structure material. In a representative embodiment, the second interlayer may be formed to a thickness of about 300 Å, for example. The second interlayer 128 fosters the growth of a highly-textured (highly oriented C-axis) piezoelectric layer 130, and reduces or minimizes oxide diffusion from the buried temperature compensation layer 124 into the piezoelectric layer 130. Outer portions of the second interlayer 128 are removed by etching, along with the etched portions of the buried temperature compensation layer 124, to expose portions of the top surface of the base electrode layer 122, so that the base electrode layer 122 is able to make an electrical connection between with the conductive interposer layer 126 (See FIG. 1 (not shown in FIG. 2E)). In other words, after etching, the second interlayer covers only the top surface of the buried temperature compensation layer 124, so that it is positioned between the buried temperature compensation layer 124 and the conductive interposer layer 126.

In an embodiment, the base electrode layer 122 of the composite first electrode 120 and the second electrode 140 are each formed of Mo. The conductive interposer layer 126 is also made of molybdenum, and in this example would be between about 300 Å and about 600 Å. The piezoelectric layer 130 is formed at a thickness of about 11,000 Å using a thin film of AlN. The acoustic stack 105 with this illustrative configuration has a zero linear temperature coefficient value. Only a residual quadratic term is left (where beta is about −22 ppB per degree $C^2$). However, the maximum coupling coefficient for the acoustic resonator device 100 of this configuration is only about four percent. In comparison, without the BSG layer, the acoustic stack 105 (as in conventional resonators) has a linear the temperature coefficient term on the order of about −24 ppm per degree C. and a coupling coefficient that should be on the order of 6.5 percent. As described above, in a known structure, the piezoelectric layer is grown over directly over the buried temperature compensation layer and the conductive interposer layer, and without the intervening second interlayer 128 of the representative embodiments. Typically, the temperature compensation layer is an amorphous layer (e.g., amorphous BSG) having no defined crystal orientation. When a piezoelectric layer is grown over an amorphous temperature compensation layer without the intervening second interlayer, the resultant piezoelectric layer will have a poor C-axis orientation characterized by a random mixture of C-axis orientations in the piezoelectric layer. Such a piezoelectric layer may fail to provide a satisfactory piezoelectric response in some acoustic resonator applications. However, by providing the second interlayer 128 on top of buried temperature compensation layer 124 as described above, a more highly textured piezoelectric layer 130 is provided in the acoustic stack 105. Accordingly, the enhanced acoustic coupling coefficient ($kt^2$) is realized in acoustic resonator devices of the present teachings.

Figure 3:
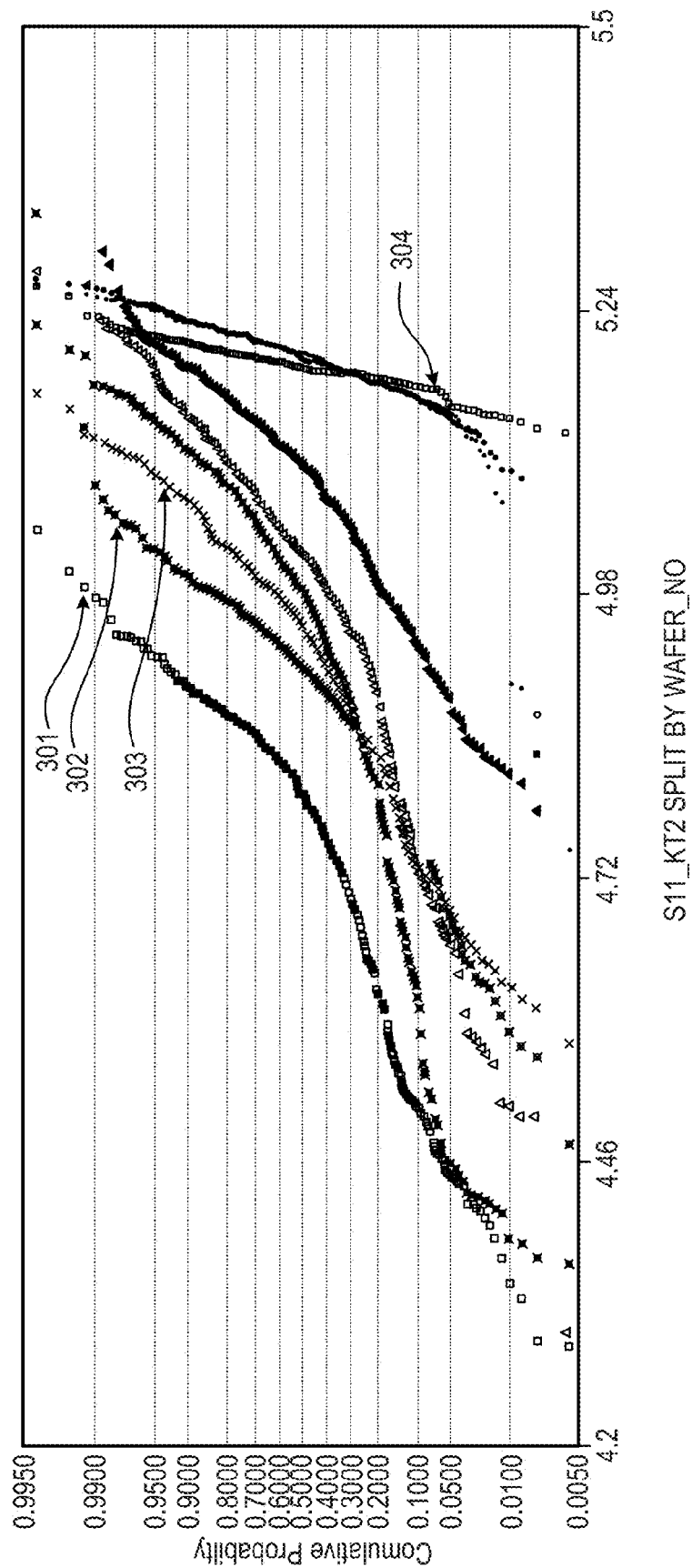
FIG. 3 is a graphical representation showing acoustic coupling coefficient ($kt^2$) of known temperature-compensated FBARs and an FBAR according to a representative embodiment.

Referring to FIG. 3, improvements in the temperature compensation and acoustic coupling coefficient ($kt^2$) of an acoustic resonator device according to a representative embodiment are depicted graphically and compared to known acoustic resonator device without the first interlayer 127 and the second interlayer 128. Specifically, curves 301, 302, 303 show the acoustic coupling coefficient ($kt^2$) of known acoustic resonator devices including a temperature compensation layer, but without either the first interlayer 127 or the second interlayer 128. By contrast, curve 304 shows the acoustic coupling coefficient ($kt^2$) of an acoustic resonator device according to a representative embodiment (e.g., acoustic resonator device 100). As can be appreciated by a review of FIG. 3, the acoustic coupling coefficient ($kt^2$) of an acoustic resonator device according to a representative embodiment is been improved by approximately 10% after adding the new interlayer. The uniformity of coupling coefficient ($kt^2$) across the wafer has also been improved with interlayers.

Figure 4:
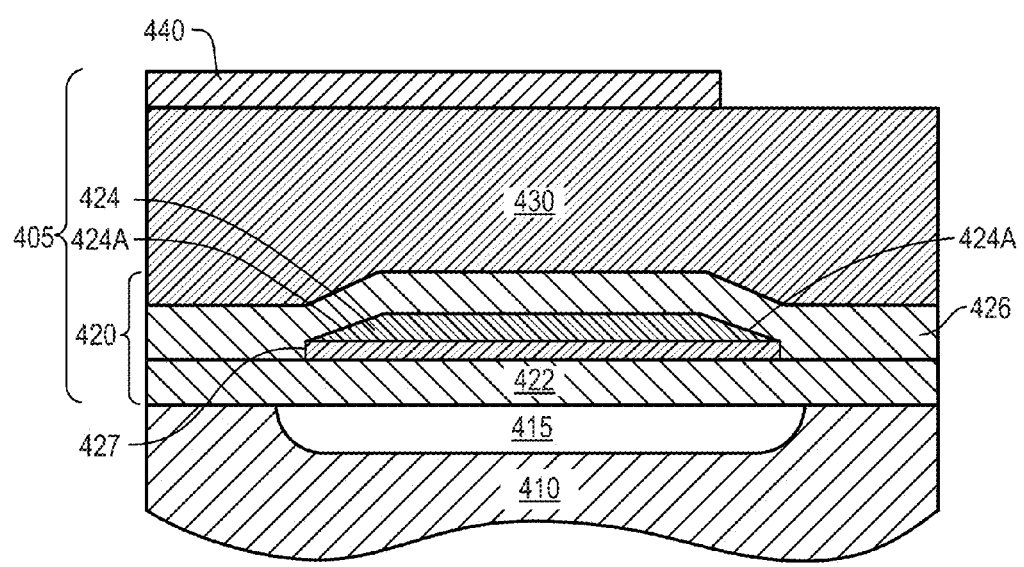
FIG. 4 is a cross-sectional diagram illustrating an acoustic resonator device, including an electrode with a buried temperature compensating layer according to a representative embodiment.

In certain embodiments, the second interlayer 128 can be foregone, and rather only the first interlayer 127 provided. FIG. 4 is a cross-sectional diagram illustrating an acoustic resonator device 400, including a composite first electrode 420 with a buried temperature compensation layer 424 and an interlayer 427 according to a representative embodiment. Many aspects of the description of the acoustic resonator device 400, its materials, dimensions and methods of fabrication are common to those of acoustic resonator device 100 described in connection with FIGS. 1-2E. Often, such common aspects of acoustic resonator devices 100, 400 are not repeated to avoid obscuring the description of the present embodiments.

Referring to FIG. 4, illustrative acoustic resonator device 100 includes acoustic stack 405 formed on substrate 410. The substrate 410 may be formed of various types of semiconductor materials compatible with semiconductor processes, such as silicon (Si), gallium arsenide (GaAs), indium phosphide (InP), or the like, which is useful for integrating connections and electronics, thus reducing size and cost. In the depicted embodiment, the substrate 410 includes a cavity 415 formed beneath the acoustic stack 405 to provide acoustic isolation, such that the acoustic stack 405 is suspended over an air space to enable mechanical movement. In alternative embodiments, the substrate 410 may be formed with no cavity 415, for example, using SMR technology. For example, the acoustic stack 405 may be formed over an acoustic mirror or a Bragg Reflector (not shown), having alternating layers of high and low acoustic impedance materials, formed in the substrate 410.

The acoustic stack 405 includes piezoelectric layer 430 formed between composite first electrode 420 and second electrode 440. In the presently described representative embodiment, the composite first electrode 420 includes multiple layers, and is referred to herein as a "composite electrode." In various embodiments, the composite first electrode 420 includes a base electrode layer 422, a buried temperature compensation layer 424, and a conductive interposer layer 426 stacked sequentially on the substrate 410. In a representative embodiment, the base electrode layer 422 or the conductive interposer layer 426, or both are formed of electrically conductive materials, such as various metals compatible with semiconductor processes, including tungsten (W), molybdenum (Mo), aluminum (Al), platinum (Pt), ruthenium (Ru), niobium (Nb), or hafnium (Hf), for example. In certain representative embodiments, at least one of the electrically conductive layers of the base electrode layer 422 and the conductive interposer layer 426 is made of a material that has a positive temperature coefficient. In accordance with a representative embodiment, the material having the positive temperature coefficient is an alloy. Illustratively, the alloy may be one of nickel-iron (Ni—Fe), niobium-molybdenum (NbMo) and nickel-titanium (NiTi).

In a representative embodiment, an interlayer 427 can be provided beneath the buried temperature compensation layer 424 and over the base electrode layer 422. Like first interlayer 127, the interlayer 427 functions as an etch-stop layer during the formation of the buried temperature compensation, and may be useful in improving positive temperature compensation effects in the acoustic stack.

In a representative embodiment, conductive interposer layer 426, or the base electrode layer 422, or both, comprise a material having a positive temperature coefficient. Notably, the material selected for the conductive interposer layer 426 should be selected to not adversely impact the quality of the crystalline structure of the piezoelectric layer 430. Stated somewhat differently, as it is desirable to provide a highly textured (i.e., well oriented C-axis) piezoelectric layer in the acoustic stack 105, it is beneficial to use a material for the conductive interposer layer 426 that will allow growth of a highly textured piezoelectric layer 130.

Finally, it is contemplated that the base electrode layer 422, the conductive interposer layer 426 and the second electrode 440 be made from one or more materials having a positive temperature coefficient to further reduce or substantially prevent the adverse impact on frequency at higher temperatures of operation.

The positive temperature coefficient of the selected base electrode layer 422, or the conductive interposer layer 426, or both, beneficially offsets negative temperature coefficients of other materials in the acoustic stack 405, including for example the piezoelectric layer 430, the second electrode 440, and any other layer of the acoustic stack that has a negative temperature coefficient. Beneficially, the inclusion of one or more layers of materials having the positive temperature coefficient for electrically conductive layers in the acoustic stack allows the same degree of temperature compensation with a thinner buried temperature compensation layer 424. Ultimately, the acoustic resonator device 400 has at least the same temperature compensation as an embodiment having base electrode layer 422, conductive interposer layer 426 and second electrode 440 made of materials with negative temperature coefficients, while at the same time having an improved coupling coefficient $kt^2$.

In various embodiments, the base electrode layer 422 and the conductive interposer layer 426 are formed of different conductive materials, where the base electrode layer 422 is formed of a material having relatively lower conductivity and relatively higher acoustic impedance, and the conductive interposer layer 426 is formed of a material having relatively higher conductivity and relatively lower acoustic impedance. For example, the base electrode layer 422 may be formed of W, Ni—Fe, NbMo, or NiTi, and the conductive interposer layer 426 may be formed of Mo, although other materials and/or combinations of materials may be used without departing from the scope of the present teachings. In accordance with a representative embodiment, the selection of the material for the conductive interposer layer 426 is made to foster growth of highly textured piezoelectric material that forms piezoelectric layer 430. Further, in various embodiments, the base electrode layer 422 and the conductive interposer layer 426 may be formed of the same conductive material, without departing from the scope of the present teachings.

As should be appreciated by one of ordinary skill in the art, the electrical conductivity and the acoustic impedance depend on the material selected for the positive temperature coefficient material provided in the acoustic stack 405. Moreover, the acoustic impedance and electrical conductivity of the positive temperature coefficient material will impact its location in the acoustic stack 405. Typically, it is useful to provide a positive temperature coefficient material having a comparatively high acoustic impedance in order to achieve a higher acoustic coupling coefficient ($kt^2$), thereby allowing a comparatively thin piezoelectric layer 430 to be provided in the acoustic stack 405. Moreover, it is useful to provide a positive temperature coefficient material having a comparatively low electrical resistance to avoid ohmic (resistive) losses in the acoustic resonator device 400. Finally, the present teachings contemplate the use of a multi-layer structure for the layer(s) of the acoustic stack having a positive temperature coefficient to achieve a comparatively high acoustic impedance and a comparatively low electrical conductivity.

The buried temperature compensation layer 424 is a temperature compensating layer, and is formed between the base electrode layer 422 and the conductive interposer layer 426. The buried temperature compensation layer 424 is therefore separated or isolated from the piezoelectric layer 430 by the conductive interposer layer 426, and is otherwise sealed in by the connection between the conductive interposer layer 426 and the base electrode layer 422. Accordingly, the buried temperature compensation layer 424 is effectively buried within the composite first electrode 420.

The buried temperature compensation layer 424 may be formed of various materials compatible with semiconductor processes, including silicon dioxide ($SiO_2$), borosilicate glass (BSG), chromium oxide ($Cr_{(x)}O_{(y)}$) or tellurium oxide ($TeO_{(x)}$), for example, which have positive temperature coefficients. The positive temperature coefficient of the buried temperature compensation layer 424 offsets negative temperature coefficients of other materials in the acoustic stack 405, including the piezoelectric layer 430, and other electrically conductive layers that are not selected to comprise a material having a positive temperature coefficient (i.e., one or more of the second electrode 440, and the base electrode layer 422 and the conductive interposer layer 426 of the composite first electrode 420, which do not comprise an electrically conductive material having a positive temperature coefficient.)

As noted previously, at least one of the base electrode layer 422, the conductive interposer layer 426 and the second electrode 440 may be made of a material that has a positive temperature coefficient. As such, the second electrode 440 may be made of material having a positive temperature coefficient, while one or both of the base electrode layer 422 and the conductive interposer layer 426 is made of a material having a negative temperature coefficient. As noted above, the material having a positive temperature coefficient may be an alloy. Illustratively, the alloy may be one of nickel-iron (Ni—Fe), niobium-molybdenum (NbMo) and nickel-titanium (NiTi). The positive temperature coefficient of the second electrode 440 beneficially offsets negative temperature coefficients of other materials in the acoustic stack 405, including for example the piezoelectric layer 430 and any other layer of the acoustic stack 405 that has a negative temperature coefficient. Beneficially, the inclusion of one or more layers of materials having the positive temperature coefficient for electrically conductive layers in the acoustic stack 405 allows the same degree of temperature compensation with a thinner buried temperature compensation layer 424. Ultimately, the acoustic resonator device 400 has at least the same temperature compensation as an embodiment having base electrode layer 422, conductive interposer layer 426 and second electrode 440 made of materials with negative temperature coefficients, while at the same time having an improved coupling coefficient $kt^2$.

As shown in the representative embodiment of FIG. 4, the buried temperature compensation layer 424 does not extend the full width of the acoustic stack 405. Thus, the conductive interposer layer 426, which is formed on the top and side surfaces of the buried temperature compensation layer 424, contacts the top surface of the base electrode layer 422, as indicated for example by reference number 429. Therefore, a DC electrical connection is formed between the conductive interposer layer 426 and the base electrode layer 422. By DC electrically connecting with the base electrode layer 422, the conductive interposer layer 426 effectively "shorts" out a capacitive component of the buried temperature compensation layer 424, thus increasing a coupling coefficient ($kt^2$) of the acoustic resonator device 400. In addition, the conductive interposer layer 426 provides a barrier that prevents oxygen in the buried temperature compensation layer 424 from diffusing into the piezoelectric layer 430, preventing contamination of the piezoelectric layer 430.

Also, in the depicted embodiment, the buried temperature compensation layer 424 has tapered edges 424a, which enhance the DC electrical connection between the conductive interposer layer 426 and the base electrode layer 422. In addition, the tapered edges 424a enhance the mechanical connection between the conductive interposer layer 426 and the base electrode layer 422, which improves the sealing quality, e.g., for preventing oxygen in the buried temperature compensation layer 424 from diffusing into the piezoelectric layer 430. In alternative embodiments, the edges of the buried temperature compensation layer 424 are not tapered, but may be substantially perpendicular to the top and bottom surfaces of the buried temperature compensation layer 424, for example, without departing from the scope of the present teachings.

In accordance with representative embodiments, the interlayer 427 is selected as an etch stop layer during the formation of the buried temperature compensation layer 424. As noted above, the buried temperature compensation layer 424 is illustratively silicon dioxide ($SiO_2$), or borosilicate glass (BSG), or chromium oxide ($Cr_{(x)}O_{(y)}$), or tellurium oxide ($TeO_{(x)}$). The interlayer 427 illustratively comprises layer of aluminum nitride (AlN) having a thickness in the range of approximately $10^1$ Å to approximately $10^3$ Å. In certain embodiments, the interlayer 427 is AlN having a thickness in the range of approximately 60 Å to approximately 150 Å. It is noted while the use of AlN as an etch-stop layer is merely illustrative, other materials are contemplated for use as the interlayer 427, depending on the selection of material for the buried temperature compensation layer 424. For example, the interlayer 427 may be a metal (e.g., aluminum), a non-metal, a ceramic, an alloy (e.g., TiW), a compound (e.g., $TiO_xN_y$), or an element useful in providing an etch-stop during formation of the buried temperature compensation layer 424.

In addition to its etch-stop properties, and as described more fully below, the interlayer 427 made of AlN has been found to improve positive temperature compensation in the acoustic stack. It is theorized that the interlayer 427 functions as a diffusion barrier which helps to prevent oxide diffusion from buried temperature compensation layer 424 to the base electrode layer 422, and thereby prevents the formation of other materials with negative temperature coefficients.

The piezoelectric layer 430 is formed over the top surface of the conductive interposer layer 426. The piezoelectric layer 430 may be formed of a thin film piezoelectric material compatible with semiconductor processes, such as aluminum nitride (AlN), zinc oxide (ZnO), lead zirconium titanate (PZT), or the like. The piezoelectric layer 430 may be fabricated according to various known techniques, examples of which are found in certain patents and patent application publications incorporated by reference above.

The thickness of the piezoelectric layer 430 may range from about 1000 Å to about 100,000 Å, for example, although the thickness may vary to provide unique benefits for any particular situation or to meet application specific design requirements of various implementations, as would be apparent to one of ordinary skill in the art.

The second electrode 440 is formed on the top surface of the piezoelectric layer 130. The second electrode 440 is formed of an electrically conductive material compatible with semiconductor processes, such as Mo, W, Al, Pt, Ru, Nb, Hf, or the like. In an embodiment, the second electrode 440 is formed of the same material as the base electrode layer 422 of the composite first electrode 420. However, in various embodiments, the second electrode 440 may be formed of the same material as only the conductive interposer layer 426; the second electrode 440, the conductive interposer layer 426 and the base electrode layer 422 may all be formed of the same material; or the second electrode 440 may be formed of a different material than both the conductive interposer layer 426 and the base electrode layer 422, without departing from the scope of the present teachings.

The second electrode 140 may further include a passivation layer (not shown), which may be formed of various types of materials, including AlN, silicon carbide (SiC), BSG, SiO$_2$, SiN, polysilicon, and the like. Illustratively, the passivation layer may be as described in U.S. Pat. No. 8,330,556, to Miller, et al. The disclosure of this patent is specifically incorporated herein by reference. The thickness of the passivation layer must be sufficient to insulate all layers of the acoustic stack 405 from the environment, including protection from moisture, corrosives, contaminants, debris and the like. The composite first electrode 420 and second electrode 440 are electrically connected to external circuitry via contact pads (not shown), which may be formed of a conductive material, such as gold, gold-tin alloy or the like.

Figure 5:
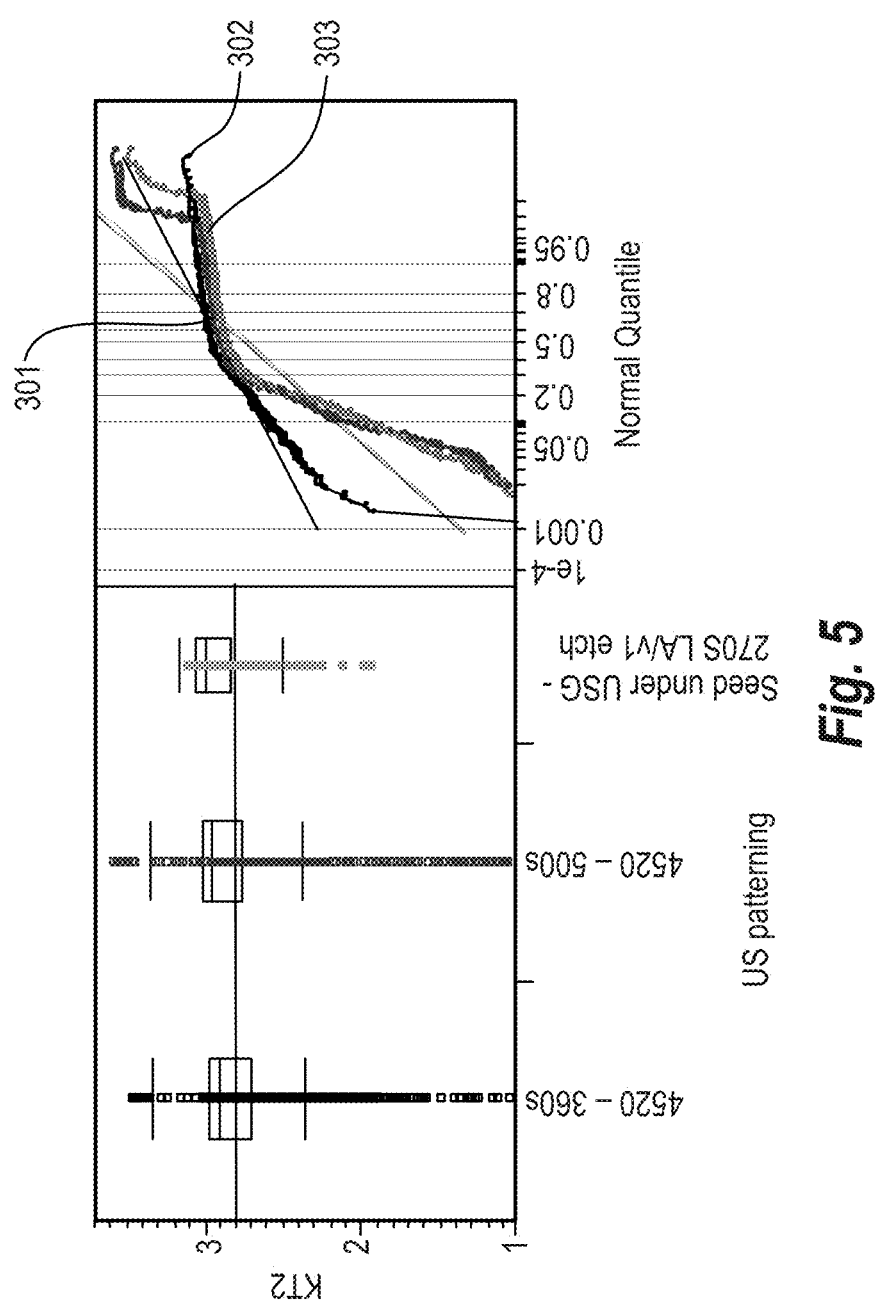
FIG. 5 is a graphical representation of acoustic coupling coefficient for an acoustic resonator device in accordance with a representative embodiment.

Referring to FIG. 5, it can be appreciated that while the median of the acoustic coupling coefficient ($kt^2$) of an acoustic resonator device according to a representative embodiment having interlayer 427 does not change significantly, the standard deviation of the distribution of the acoustic coupling coefficient ($kt^2$) is reduced. The improved control can be used to enhance performance and/or to improve yield of the resulting resonator device. The improved uniformity of the acoustic coupling coefficient ($kt^2$) across wafer provides a clear benefit in the manufacture of devices (e.g., RF filters) that include BAW resonators.

Figure 6:
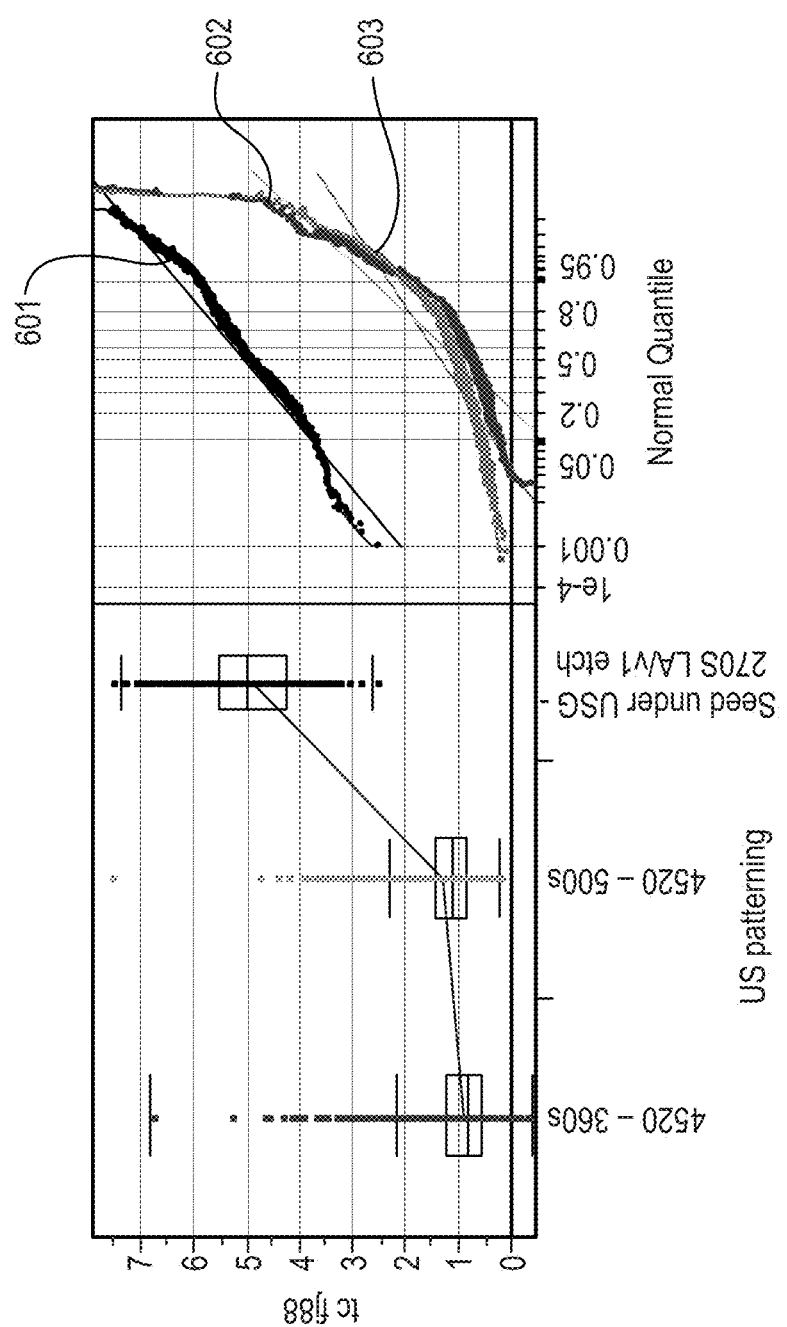
FIG. 6 is a graphical representation of temperature compensation for an acoustic resonator device in accordance with a representative embodiment.

Moreover, through the incorporation of first interlayer 427 of the representative embodiment of FIG. 1 or the interlayer 427 of the representative embodiment of FIG. 4, improvements in the temperature compensation in acoustic stacks 105 and 405, respectively, are realized. As depicted in FIG. 6 inclusion of first interlayer 127 or interlayer 427 provides a 3-4 ppm/° C. positive effect on temperature compensation compared to known acoustic resonators that do not include first interlayer 127 or interlayer 427. Specifically, curve 601 depicts the temperature compensation of an acoustic resonator of a representative embodiment, and curves 602 and 603 depict the temperature compensation of a known acoustic resonator. As can be appreciated, the positive temperature compensation is improved by about 10-15% with the inclusion of first interlayer 127 or interlayer 427.

Figure 7:
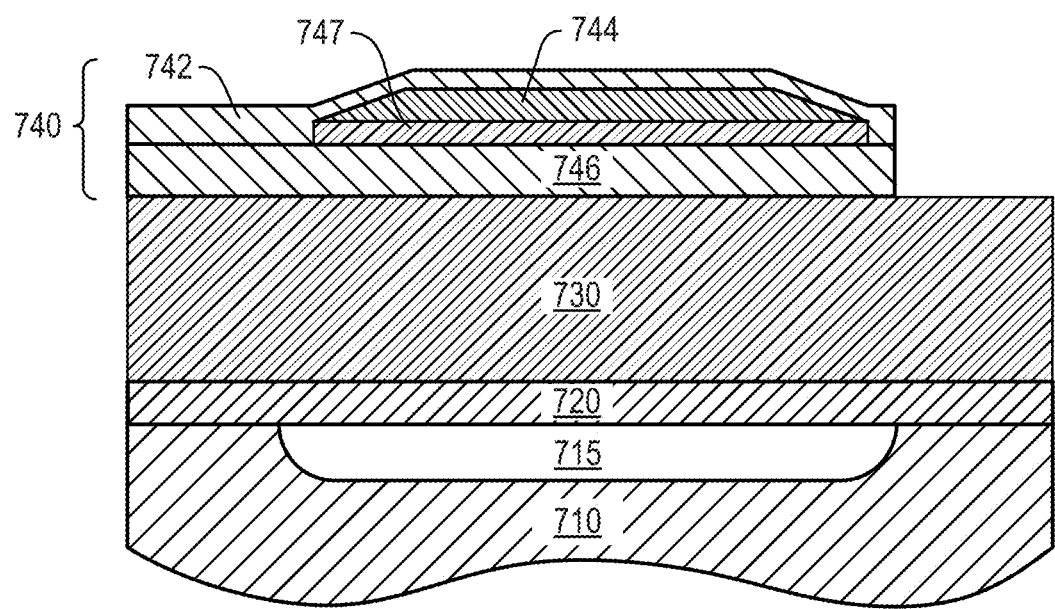
FIG. 7 is a cross-sectional diagram illustrating an acoustic resonator device, including an electrode with a buried temperature compensating layer according to a representative embodiment.

FIG. 7 is a cross-sectional view of an acoustic resonator device 700, which includes an electrode having a buried temperature compensating layer, according to a representative embodiment, in which the acoustic stack of the resonator device is reversed compared to the representative embodiment of FIG. 4, such that the second (top) electrode is a composite electrode, as opposed to the first (bottom) electrode as depicted in FIG. 4. Many aspects of the description of the acoustic resonator device 700, its materials, dimensions and methods of fabrication are common to those of acoustic resonator devices 100, 400 described in connection with FIGS. 1-4. Often, such common aspects of acoustic resonator devices 100, 400 and 700 are not repeated to avoid obscuring the description of the present embodiments. Conspicuously missing from acoustic resonator device 700 is a second interlayer. As can be appreciated, such a layer would have no impact on the quality of the grown piezoelectric layer of an acoustic stack, which is beneath a composite electrode.

Referring to FIG. 7, illustrative acoustic resonator device 700 includes acoustic stack 705 formed on substrate 710. The substrate 710 may be formed of various types of semiconductor materials, Si, GaAs, InP, or the like, and may include a cavity 715 or an acoustic isolator, as discussed above with respect to substrate 110 in FIG. 1. The acoustic stack 705 includes piezoelectric layer 730 formed between a first electrode 720 and a composite second electrode 740. Like acoustic resonator device 100, at least one of the electrically conductive layers of the acoustic stack may have a positive temperature coefficient to realize a desired temperature compensation for the acoustic resonator device 700, and an improvement in the a coupling coefficient $kt^2$ by the reduction of the thickness of the temperature compensation layer compared to an acoustic resonator device that does not include an electrically conductive layer in the acoustic stack having a positive temperature compensation material.

In a representative embodiment, the first electrode 720 is formed of an electrically conductive material, such as W, Mo, Al, Pt, Ru, Nb or Hf, for example, on the substrate 710. Alternatively, the first electrode 720 may be made of a material having a positive temperature coefficient, such as an alloy of Ni—Fe, NbMo or NiTi. The piezoelectric layer 730 is formed of a piezoelectric material, such as AlN, ZnO or PZT, for example, on the first electrode 720. The composite second electrode 740 is formed on the piezoelectric layer 730, such that a buried temperature compensation layer 744 is separated from the piezoelectric layer 730 by a conductive interposer layer 746.

For example, in an embodiment, the conductive interposer layer 746 is applied to the top, substantially planar surface of the piezoelectric layer 430 at a desired thickness $T_{746}$. As discussed above, the thicker the conductive interposer layer 746, the more buried the buried temperature compensation layer 744 is within the composite second electrode 740 (i.e., further moved from the piezoelectric layer 730). The buried temperature compensation layer 744 is then applied to the top surface of the conductive interposer layer 746 to form a temperature compensating layer. The buried temperature compensation layer 744 may be applied using spin-on, sputtering, evaporation or CVD techniques, for example, although other application methods may be incorporated. Also, the buried temperature compensation layer 744 is etched to a desired size and the edges 744a may be tapered, as discussed above with respect to the buried temperature compensation layer 724.

The electrode layer 742 is formed over the buried temperature compensation layer 744 and the conductive interposer layer 746. The electrode layer 742 has a thickness $T_{742}$ (at outer portions, not over the buried temperature compensation layer 744), which may include a passivation layer (not shown), as discussed above. The thickness $T_{742}$ may vary such that an overall second thickness $T_{740}$ of the composite second electrode 740 is substantially the same as an overall first thickness $T_{720}$ of the first electrode 720. Alternatively, the thickness $T_{740}$ of the composite second electrode 740 and the overall first thickness $T_{720}$ of the first electrode 720 may differ depending on the desired temperature coefficient, acoustic coupling coefficient ($kt^2$) and frequency target of the acoustic stack 705. Similarly, the thickness of the buried temperature compensation layer 744 may be varied to affect the overall temperature coefficient of the acoustic stack 705, and the relative thicknesses of the electrode layer 742 and the conductive interposer layer 746 may be varied to affect the overall coupling coefficient of the acoustic resonator device 700.

As discussed above, the conductive interposer layer 746 and the electrode layer 742 are formed of electrically conductive materials, such as W, Mo, Al, Pt, Ru, Nb or Hf, for example. Alternatively, at least one of the conductive interposer layer 746 and the electrode layer 742 are formed of an electrically conductive material having a positive temperature coefficient, such as an alloy of Ni—Fe, NbMo or NiTi. Also, the conductive interposer layer 746 and the electrode layer 742 may be formed of the same or different materials, to provide various benefits or to meet application specific design requirements of various implementations, as would be apparent to one of ordinary skill in the art. In an embodiment, the electrode layer 742 is formed of the same material as the first electrode 720, although the electrode layer 742 and the first electrode 720 may be formed of different materials from one another in alternative embodiments.

The buried temperature compensation layer 744 is a temperature compensating layer, formed between the conductive interposer layer 746 and the electrode layer 742, in substantially the same manner discussed above with respect to buried temperature compensation layer 724. The buried temperature compensation layer 744 may be formed of various materials compatible with semiconductor processes, including $SiO_2$, BSG, SiN, or polysilicon, for example, which have positive temperature coefficients. Because the buried temperature compensation layer 744 does not extend the full width of the acoustic stack 705, the conductive interposer layer 446 forms a DC electrical connection with the electrode layer 742, which effectively "shorts" out a capacitive component of the buried temperature compensation layer 444 and increases a coupling coefficient ($kt^2$) of the acoustic stack 705, as discussed above. In addition, the conductive interposer layer 746 provides a barrier that prevents oxygen in the buried temperature compensation layer 744 from diffusing into the piezoelectric layer 730.

In a representative embodiment, an interlayer 727 can be provided beneath the buried temperature compensation layer 724 and over the conductive interposer layer 746. Like first interlayer 127, the interlayer 727 functions as an etch-stop layer during the formation of the buried temperature compensation, and may be useful in improving positive temperature compensation effects in the acoustic stack.

In accordance with representative embodiments, the interlayer 727 is selected as an etch stop layer during the formation of the buried temperature compensation layer 724. As noted above, the buried temperature compensation layer 724 is illustratively silicon dioxide ($SiO_2$), or borosilicate glass (BSG), or chromium oxide ($Cr_{(x)}O_{(y)}$), or tellurium oxide ($TeO_{(x)}$). The interlayer 727 illustratively comprises layer of aluminum nitride (AlN) having a thickness in the range of approximately $10^1$ Å to approximately $10^3$ Å. In certain embodiments, the interlayer 727 is AlN having a thickness in the range of approximately 60 Å to approximately 150 Å. It is noted while the use of AlN as an etch-stop layer is merely illustrative, other materials are contemplated for use as the interlayer 727, depending on the selection of material for the buried temperature compensation layer 724. For example, the interlayer 727 may be a metal (e.g., aluminum), a non-metal, a ceramic, an alloy (e.g., TiW), a compound (e.g., $TiO_xN_y$), or an element useful in providing an etch-stop during formation of the buried temperature compensation layer 724.

In addition to its etch-stop properties, and as described more fully below, the interlayer 727 made of AlN has been found to improve positive temperature compensation in the acoustic stack. It is theorized that the interlayer 727 functions as a diffusion barrier which helps to prevent oxide diffusion from buried temperature compensation layer 724 to the base electrode 722, and thereby prevents the formation of other materials with negative temperature coefficients.

The various components, materials, structures and parameters are included by way of illustration and example only and not in any limiting sense. In view of this disclosure, those skilled in the art can implement the present teachings in determining their own applications and needed components, materials, structures and equipment to implement these applications, while remaining within the scope of the appended claims.

The invention claimed is:

1. An acoustic resonator device comprising:
a composite first electrode disposed over a substrate, the composite first electrode comprising: a first electrically conductive layer provided over the substrate; a first interlayer disposed on the first electrically conductive layer; a buried temperature compensation layer disposed over the first interlayer; a second interlayer disposed over the temperature compensation layer, and a second electrically conductive layer disposed over the second interlayer;
a piezoelectric layer disposed over the composite first electrode, the piezoelectric layer having a negative temperature coefficient; and
a second electrode disposed over the piezoelectric layer.

2. An acoustic resonator device as claimed in claim 1, wherein the piezoelectric layer has a negative temperature coefficient and at least one of the first electrically conductive layer, the second electrically conductive layer and the second electrode has a positive temperature coefficient that offsets at least a portion of the negative temperature coefficient of the piezoelectric layer.

3. An acoustic resonator device as claimed in claim 1, wherein at least one of the first and second interlayers has a positive temperature coefficient.

4. An acoustic resonator as claimed in claim 1, wherein the second interlayer comprises a seed layer that fosters growth of highly textured piezoelectric material.

5. An acoustic resonator device as claimed in claim 1, wherein the first interlayer is an etch-stop layer.

6. An acoustic resonator as claimed in claim 1, wherein the first interlayer comprises a same material as the piezoelectric layer.

7. An acoustic resonator as claimed in claim 6, wherein the material comprises aluminum nitride (AlN).

8. An acoustic resonator as claimed in claim 1, wherein the second interlayer comprises a same material as the piezoelectric layer, or a material having a hexagonal crystal structure, or composition of interlayer from same piezoelectric layer (AlN) and hexagonal crystal structure materials.

9. An acoustic resonator as claimed in claim 8, wherein the piezoelectric layer comprises aluminum nitride (AlN).

10. An acoustic resonator as claimed in claim 8, wherein the material has a thickness in the range of approximately $10^1$ Å to approximately $10^3$ Å.

11. An acoustic resonator as claimed in claim 8, wherein the material has a thickness in the range of approximately 60 Å to approximately 150 Å.

12. An acoustic resonator device as claimed in claim 5, wherein the first interlayer comprises one of: Aluminum (Al), Silicon Carbide (SiC), Titanium Tungsten (TiW), or titanium oxynitride ($TiO_xN_y$).

13. An acoustic resonator device comprising:
a composite first electrode disposed over a substrate, the composite first electrode comprising: a first electrically conductive layer provided over the substrate; an interlayer disposed on the first electrical conductive layer; a buried temperature compensation layer disposed over the interlayer; and a second electrically conductive layer disposed over the buried temperature compensation layer;
a piezoelectric layer disposed over the composite first electrode; and
a second electrode disposed over the piezoelectric layer.

14. An acoustic resonator device as claimed in claim 13, wherein the piezoelectric layer has a negative temperature coefficient and at least one of the first electrically conductive layer, the second electrically conductive layer and the second electrode has a positive temperature coefficient that offsets at least a portion of the negative temperature coefficient of the piezoelectric layer.

15. An acoustic resonator device as claimed in claim 13, wherein the interlayer has a positive temperature coefficient.

16. An acoustic resonator as claimed in claim 13, wherein the interlayer comprises a same material as the piezoelectric layer.

17. An acoustic resonator as claimed in claim 13, wherein the material comprises aluminum nitride (AlN).

18. An acoustic resonator as claimed in claim 16, wherein the material has a thickness in the range of approximately $10^1$ Å to approximately $10^3$ Å.

19. An acoustic resonator comprising:
a first electrode disposed over a substrate;
a piezoelectric layer disposed over the first electrode; and
a composite second electrode comprising disposed over the piezoelectric layer, the second electrode comprising: a first electrically conductive layer provided over the piezoelectric layer; a second electrically conductive layer disposed over the first electrically conductive layer; a buried temperature compensating layer provided between the first and second electrically conductive layers; and an interlayer disposed beneath the buried temperature compensating layer and over the first electrically conductive layer.

20. An acoustic resonator as claimed in claim 19, wherein the piezoelectric layer has a negative temperature coefficient and at least one of the first electrically conductive layer, the second electrically conductive layer and the second electrode has a positive temperature coefficient that offsets at least a portion of the negative temperature coefficient of the piezoelectric layer.

21. An acoustic resonator as claimed in claim 19, wherein the interlayer is an etch-stop layer.

22. An acoustic resonator as claimed in claim 21, wherein the interlayer comprises one of: Aluminum Nitride (AlN), Aluminum (Al), Silicon Carbide (SiC), Titanium Tungsten (TiW), or titanium oxynitride ($TiO_xN_y$).

* * * * *